(12) United States Patent
Zhu

(10) Patent No.: US 12,382,643 B2
(45) Date of Patent: Aug. 5, 2025

(54) METHOD OF FORMING SEMICONDUCTOR STRUCTURE AND SEMICONDUCTOR STRUCTURE

(71) Applicant: CHANGXIN MEMORY TECHNOLOGIES, INC., Hefei (CN)

(72) Inventor: Liuyang Zhu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 486 days.

(21) Appl. No.: 17/936,136

(22) Filed: Sep. 28, 2022

(65) Prior Publication Data
US 2023/0361165 A1 Nov. 9, 2023

(30) Foreign Application Priority Data
May 6, 2022 (CN) .......................... 202210532075.9

(51) Int. Cl.
| | |
|---|---|
| H01L 21/311 | (2006.01) |
| H01L 21/033 | (2006.01) |
| H10D 1/00 | (2025.01) |
| H10D 1/68 | (2025.01) |

(52) U.S. Cl.
CPC ......... H10D 1/042 (2025.01); H01L 21/0332 (2013.01); H01L 21/31144 (2013.01); H10D 1/716 (2025.01)

(58) Field of Classification Search
CPC ................ H10D 1/042; H01L 21/0332; H01L 21/31144
See application file for complete search history.

(56) References Cited

FOREIGN PATENT DOCUMENTS

| CN | 108538835 A | * | 9/2018 | ......... H01L 27/0805 |
|---|---|---|---|---|
| CN | 209087833 U | * | 7/2019 | ............. H01L 28/60 |
| CN | 209119168 U | * | 7/2019 | ............... H10D 1/68 |
| CN | 112635462 A | * | 4/2021 | ............. H10B 12/31 |
| CN | 112736035 A |   | 4/2021 | |

* cited by examiner

*Primary Examiner* — Mohammad M Choudhry
(74) *Attorney, Agent, or Firm* — Kilpatrick Townsend & Stockton LLP

(57) ABSTRACT

The present disclosure relates to the technical field of semiconductors, and provides a method of forming a semiconductor structure, and a semiconductor structure, including: a first stacked structure, a second stacked structure, and a third stacked structure are formed from top to bottom on a substrate; etching the first stacked structure by a first mask layer, to form a first patterned hard mask; forming a second hard mask and a second mask layer having a plurality of second patterns on the first patterned hard mask, the first pattern at least partially overlaps with the second pattern, and an overlapping region forms a third pattern; and etching the second hard mask and the second stacked structure based on the second mask layer, to form a third patterned hard mask having the third patterns, and etching the third stacked structure based on the third patterned hard mask, to form contact holes.

15 Claims, 15 Drawing Sheets

METHOD OF FORMING SEMICONDUCTOR STRUCTURE AND SEMICONDUCTOR STRUCTURE

CROSS-REFERENCE TO RELATED APPLICATION

This disclosure claims the priority of Chinese Patent Application No. 202210532075.9, submitted to the Chinese Intellectual Property Office on May 6, 2022, the disclosure of which is incorporated herein in its entirety by reference.

TECHNICAL FIELD

The present disclosure relates to the technical field of semiconductors, and in particular, to a method of forming a semiconductor structure and a semiconductor structure.

BACKGROUND

Photolithography is the core of the semiconductor manufacturing process, and is one of the most important process steps in the production of integrated circuits. With the development of semiconductor manufacturing technology, the integration level is increasing, the size of components is shrinking, and the critical dimension is getting smaller, which requires higher resolution in the lithography process.

In the formation process of a dynamic random access memory (DRAM), the capacitor structure hole is formed by the intersection of two mask patterns, i.e., by an intersection area of line patterns. The process is reduced by multiple self-aligned double patterning (SADP) processes, to increase the integration density of the capacitor structure. However, due to the exposure limit in the lithography process, the method for increasing the CAP integration density by multiple SADP processes is not only complex and costly, but also leads to poor critical dimension uniformity (CDU) of the capacitor structure, which increases the risk of capacitor structure defect.

SUMMARY

According to a first aspect, the present disclosure provides a method of forming a semiconductor structure. The method includes:

providing a semiconductor substrate, where a first stacked structure, a second stacked structure, and a third stacked structure are formed from top to bottom on the substrate;

forming a first mask layer having a plurality of first patterns arranged in a staggered manner on the first stacked structure;

etching the first stacked structure by the first mask layer as a mask, to form a first patterned hard mask;

forming a second hard mask on the first patterned hard mask, and forming a second mask layer having a plurality of second patterns arranged in a staggered manner on the second hard mask, where the first pattern at least partially overlaps with the second pattern, an overlapping region forms a third pattern, and a plurality of third patterns are arranged in a staggered manner; and etching the second hard mask and the second stacked structure by the second mask layer as a mask, to form a third patterned hard mask having the third patterns, and etching the third stacked structure based on the third patterned hard mask as a mask, to form contact holes.78

A second aspect of the present disclosure provides a semiconductor structure, where the semiconductor structure includes:

a semiconductor substrate, and contact pads, contact holes, and a support layer that are arranged on the semiconductor substrate, where the contact hole at least partially exposes an upper surface of the contact pad;

a bottom electrode layer, arranged in the contact hole and covering an upper surface of the exposed contact pad, where the bottom electrode layer is connected to the support layer;

a capacitive dielectric layer, covering surfaces of the bottom electrode layer and the support layer; and a top electrode layer, covering an outer surface of the capacitive dielectric layer.

BRIEF DESCRIPTION OF THE DRAWINGS

The accompanying drawings incorporated into the specification and constituting a part of the specification illustrate the embodiments of the present disclosure, and are used together with the description to explain the principles of the embodiments of the present disclosure. In these accompanying drawings, similar reference numerals represent similar elements. The accompanying drawings in the following description illustrate some rather than all of the embodiments of the present disclosure. Those skilled in the art may obtain other accompanying drawings based on these accompanying drawings without creative efforts.

DETAILED DESCRIPTION

To make the objectives, technical solutions, and advantages of the embodiments of the present disclosure clearer, the following clearly and completely describes the technical solutions in the embodiments of the present disclosure with reference to the accompanying drawings in the embodiments of the present disclosure. Apparently, the described embodiments are some rather than all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

Figure 1:
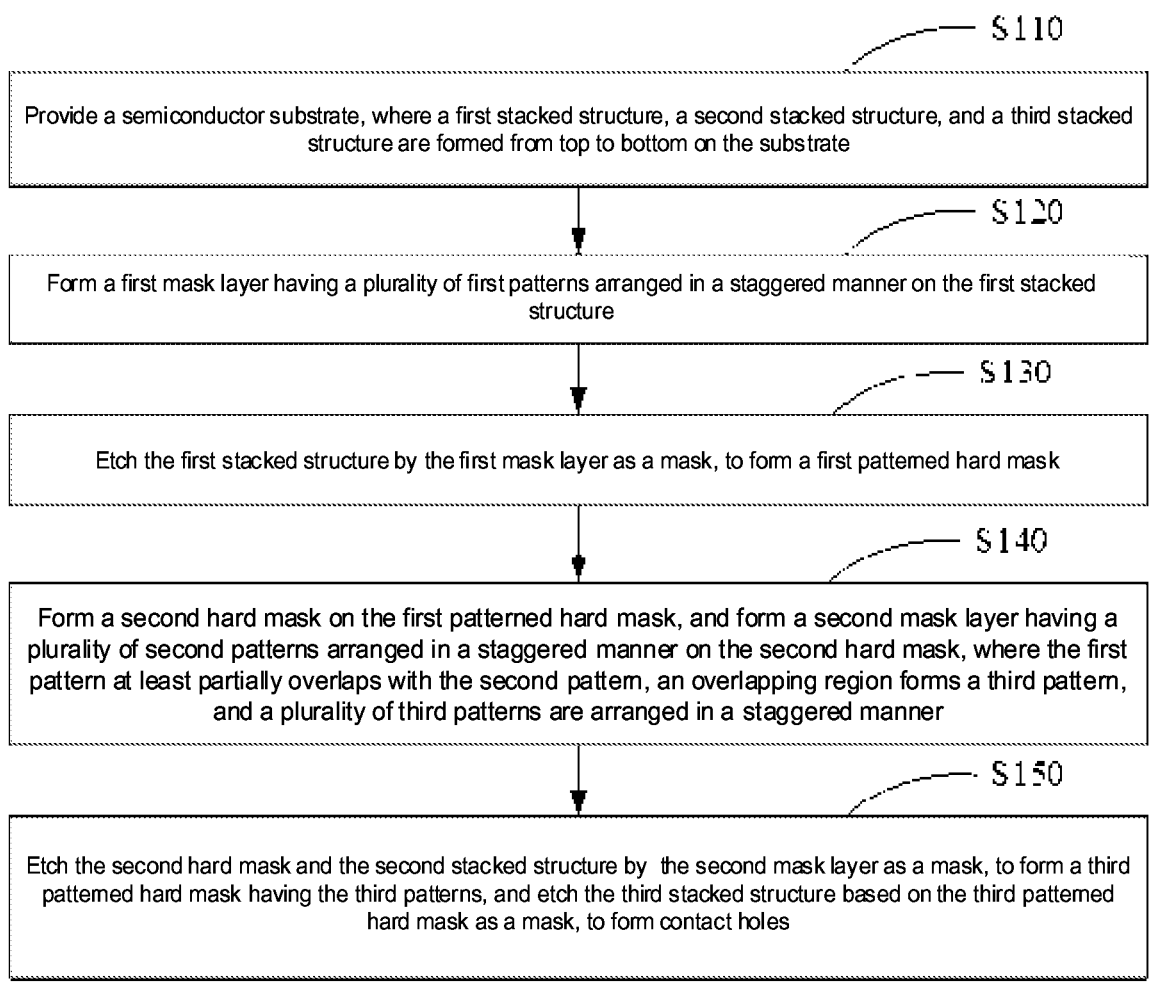
FIG. 1 is a flowchart of a method of forming a semiconductor structure according to an exemplary embodiment.

An exemplary embodiment of the present disclosure provides a method of forming a semiconductor structure, as shown in FIG. 1. FIG. 1 is a flowchart of a method of forming a semiconductor structure according to an exemplary embodiment of the present disclosure. FIG. 3 to FIG. 22 are schematic diagrams of various stages of the method of forming a semiconductor structure. The method of forming a semiconductor structure is described below with reference to FIG. 3 to FIG. 22.

The semiconductor structure is not limited in this embodiment. The semiconductor structure is described below by taking a dynamic random access memory (DRAM) as an example, but this embodiment is not limited thereto, and the semiconductor structure in this embodiment may also be other structures.

As shown in FIG. 1, an exemplary embodiment of the present disclosure provides a method of forming a semiconductor structure. The method includes the following steps:

Step S110: Provide a semiconductor substrate, where a first stacked structure, a second stacked structure, and a third stacked structure are formed from top to bottom on the substrate.

Figure 3:
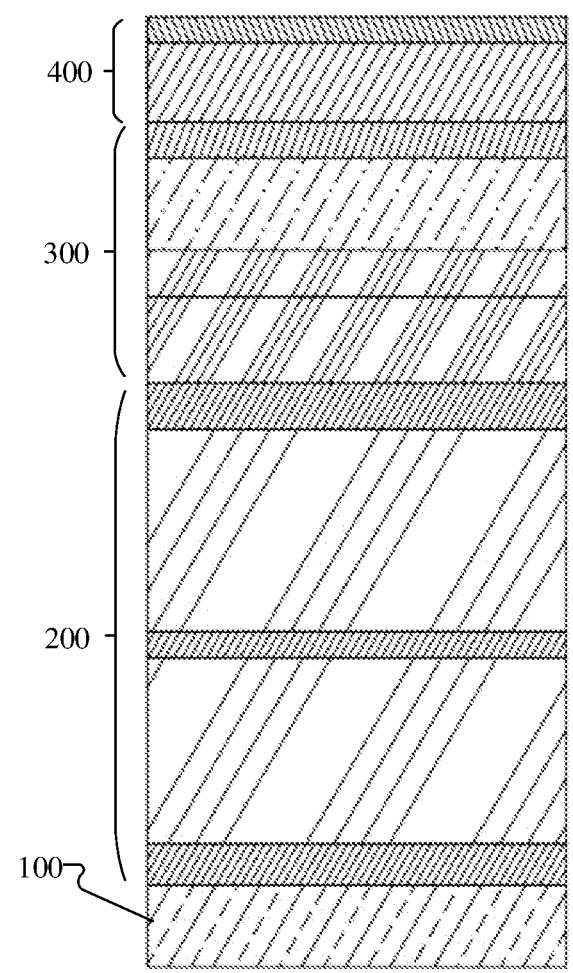
FIG. 3 is a schematic structural diagram of a semiconductor substrate of a semiconductor structure according to an exemplary embodiment.

As shown in FIG. 3, the semiconductor substrate 100 serves as a support member of a memory and is used to support other components provided thereon. The semiconductor substrate 100 may be made of silicon or other semiconductor materials. The semiconductor material may be one or more of the group consisting of silicon, germanium, silicon-germanium, and silicon-carbon.

In some exemplary embodiments, as shown in FIG. 3, a third stacked structure 200, a second stacked structure 300, and a first stacked structure 400 are sequentially formed alternately on the semiconductor substrate 100, to form a stack structure that is stacked from bottom to top. Each stacked structure may include oxide layers and nitride layers that are alternately stacked.

As shown in FIG. 3, the third stacked structure 200 is located close to a surface of the semiconductor substrate 100, e.g., connected to the surface of the semiconductor substrate 100. The first stacked structure 400 is away from the surface of the semiconductor substrate 100. The second stacked structure 300 is located between the first stacked structure 400 and the third stacked structure 200. In some embodiments, each stacked structure may be a multilayer composite structure including two or more layers. For example, the first stacked structure 400 may be a composite structure including three or less than three layers; the second stacked structure 300 and the third stacked structure 200 each may be a composite structure including three or more layers, which is not specifically limited herein. In some embodiments, the third stacked structure 200 includes a sacrificial layer, a first capacitive support layer, and a second capacitive support layer.

Step S120: Form a first mask layer having a plurality of first patterns arranged in a staggered manner on the first stacked structure.

Figure 4:
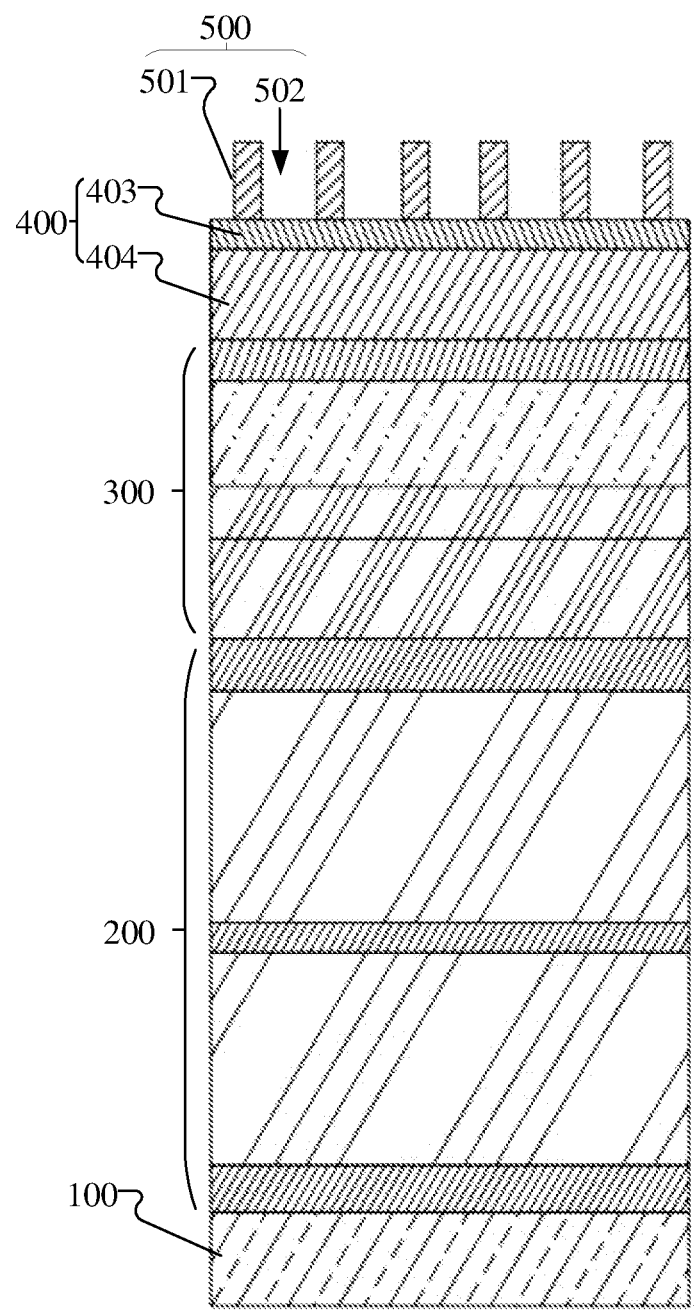
FIG. 4 is a schematic structural diagram after a first mask layer is formed in steps of a manufacturing method of a semiconductor structure according to an exemplary embodiment.
Figure 5:
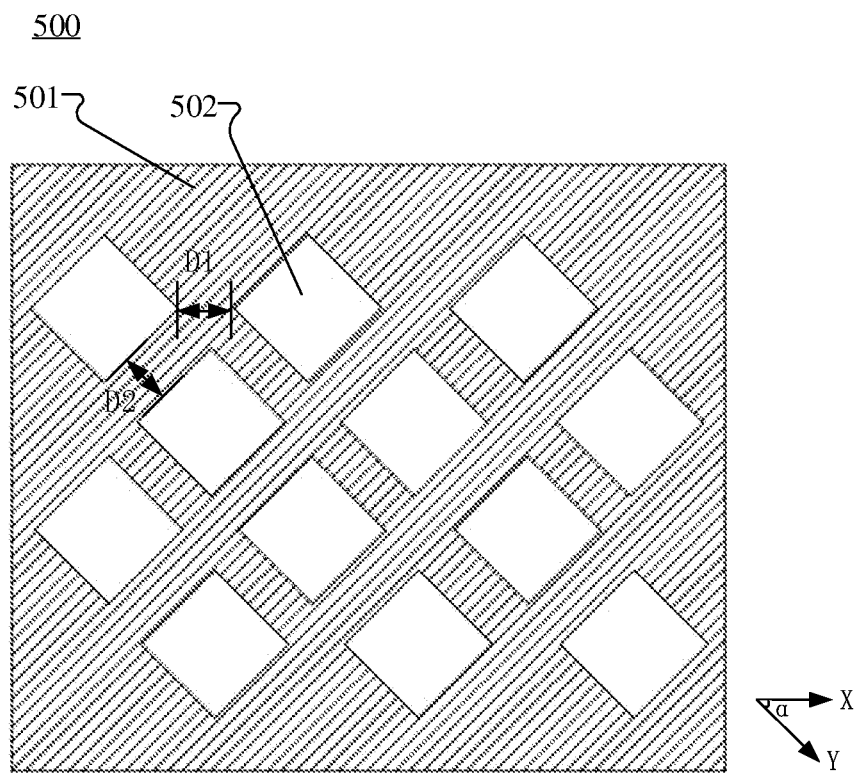
FIG. 5 is a distribution diagram of first patterns in steps of a method of forming a semiconductor structure according to an exemplary embodiment.
Figure 6:
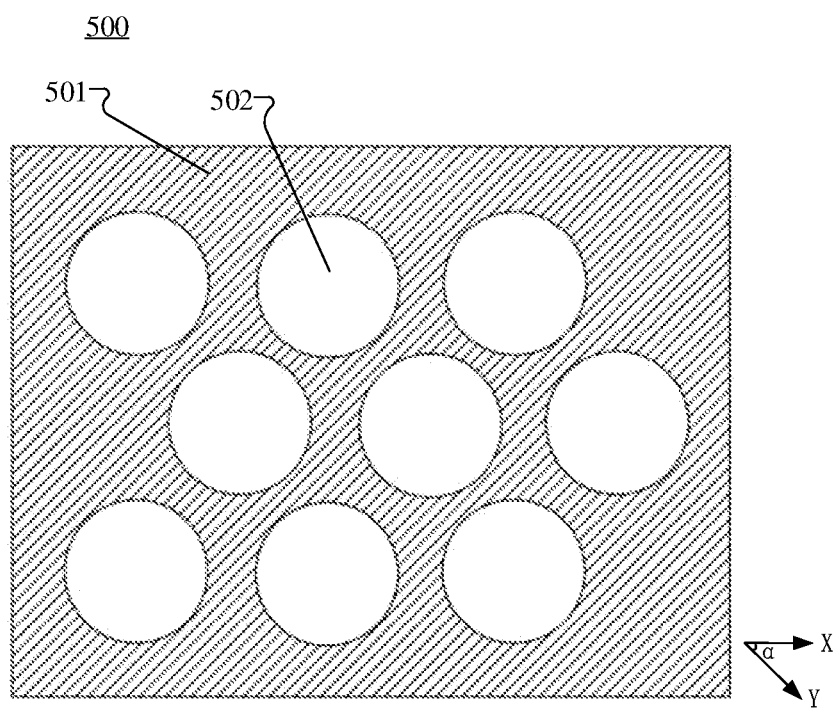
FIG. 6 is a distribution diagram of first patterns in steps of a method of forming a semiconductor structure according to an exemplary embodiment.

As shown in FIG. 4, a patterned first mask layer 500 may be formed on a surface of the first stacked structure 400. The patterned first mask layer 500 includes a plurality of openings, that is, a plurality of first patterns 502. The first patterns 502 expose partial surface of the first stacked structure 400. As shown in FIG. 5 and FIG. 6, the first patterns 502 on the first mask layer 500 are in an array in a staggered manner at equal intervals. The first patterns 502 may be in one or more of the following shapes: square, circle, diamond, rectangle, parallelogram, or the like.

Step S130: Etch the first stacked structure by the first mask layer as a mask, to form a first patterned hard mask.

Figure 7:
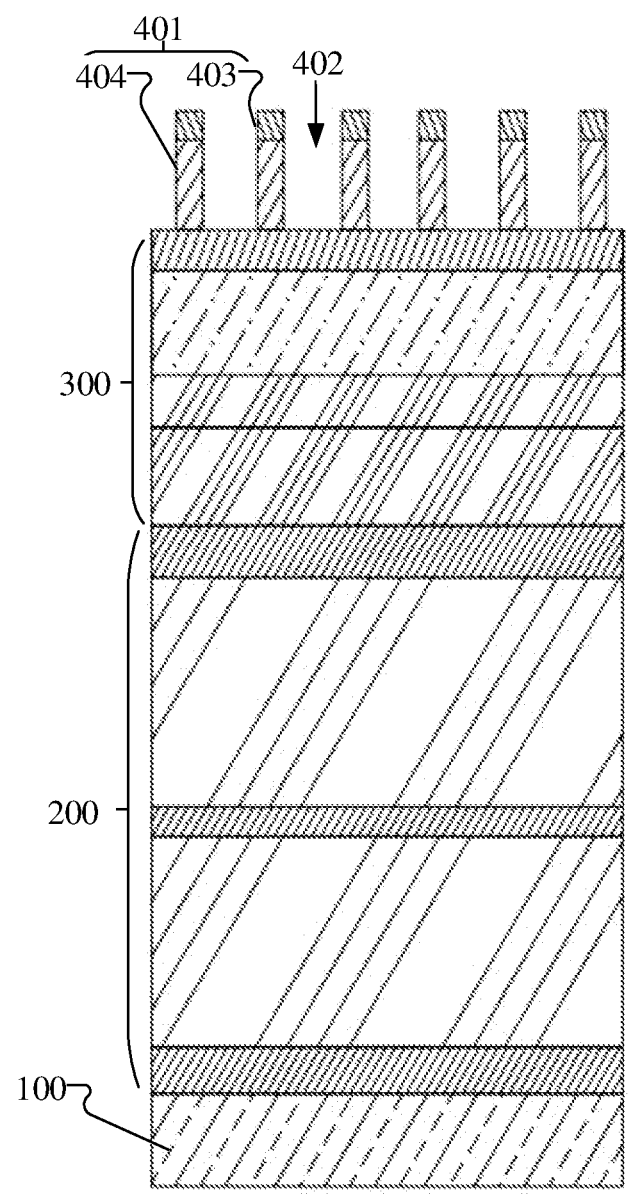
FIG. 7 is a schematic structural diagram after a first patterned hard mask is formed in steps of a manufacturing method of a semiconductor structure according to an exemplary embodiment.

As shown in FIG. 4 and FIG. 7, the first stacked structure 400 is etched by the patterned first mask layer 500 as a mask. For example, the first stacked structure 400 not covered by the first mask layer 500 is removed by an etching process, until the surface of the second stacked structure 300 is exposed. Then, the etching process stops. As shown in FIG. 4 and FIG. 7, the first patterns 502 are transferred to the first stacked structure 400 to form opening patterns 402, and the remaining first stacked structure 400 serves as a first patterned hard mask 401. Finally, the first mask layer 500 located on the first patterned hard mask 401 may be removed.

Step S140: Form a second hard mask on the first patterned hard mask, and form a second mask layer having a plurality of second patterns arranged in a staggered manner on the second hard mask, where the first pattern at least partially overlaps with the second pattern, an overlapping region forms a third pattern, and a plurality of third patterns are arranged in a staggered manner.

Figure 8:
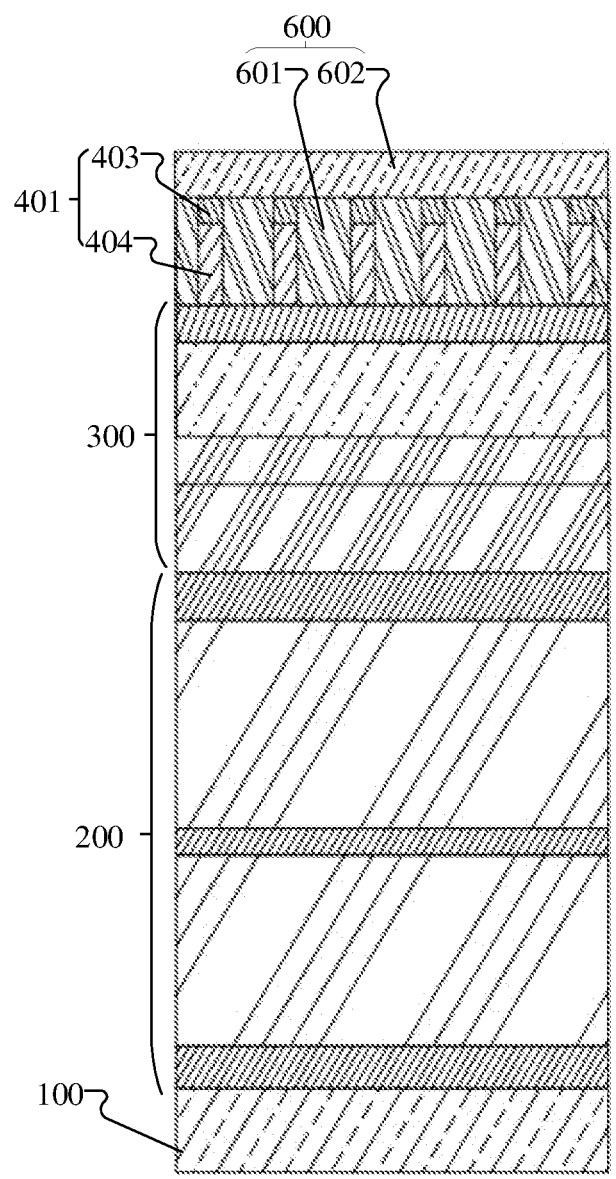
FIG. 8 is a schematic structural diagram after a second hard mask is formed in steps of a manufacturing method of a semiconductor structure according to an exemplary embodiment.
Figure 9:
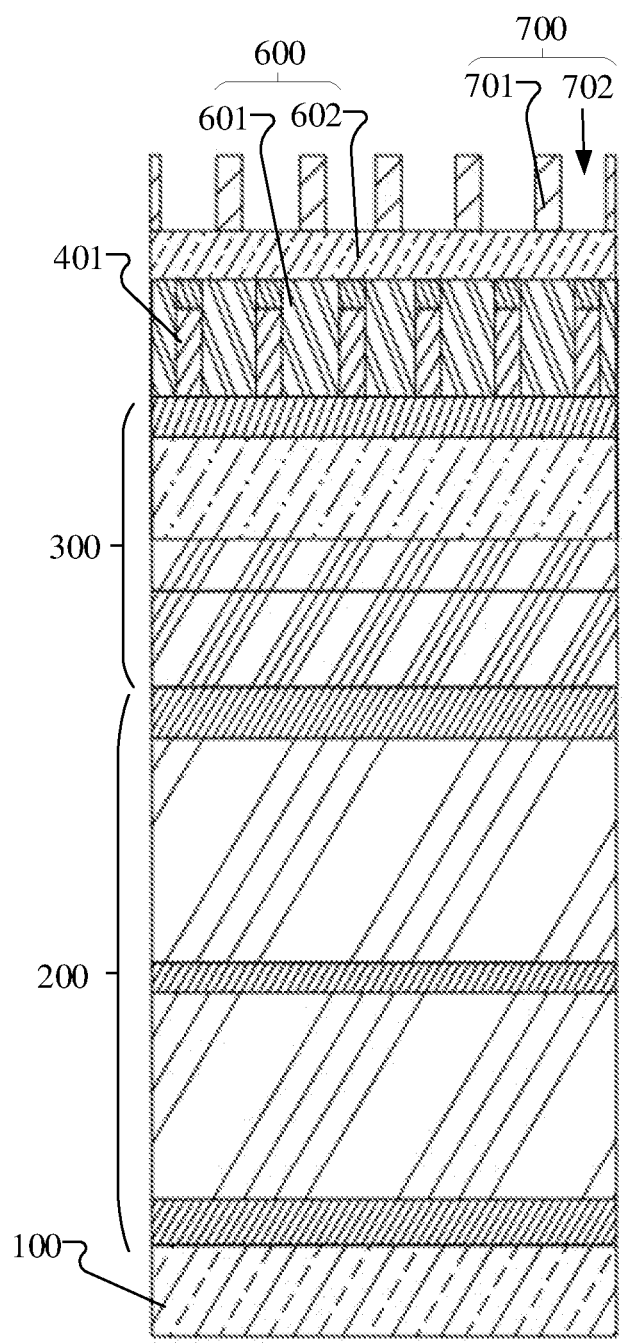
FIG. 9 is a schematic structural diagram after a second mask layer is formed in steps of a manufacturing method of a semiconductor structure according to an exemplary embodiment.
Figure 10:
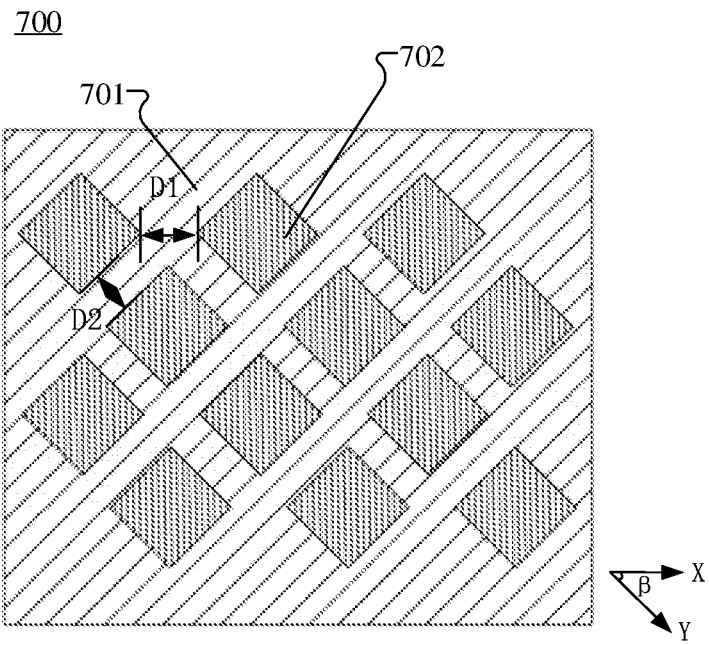
FIG. 10 is a distribution diagram of second patterns in steps of a method of forming a semiconductor structure according to an exemplary embodiment.
Figure 11:
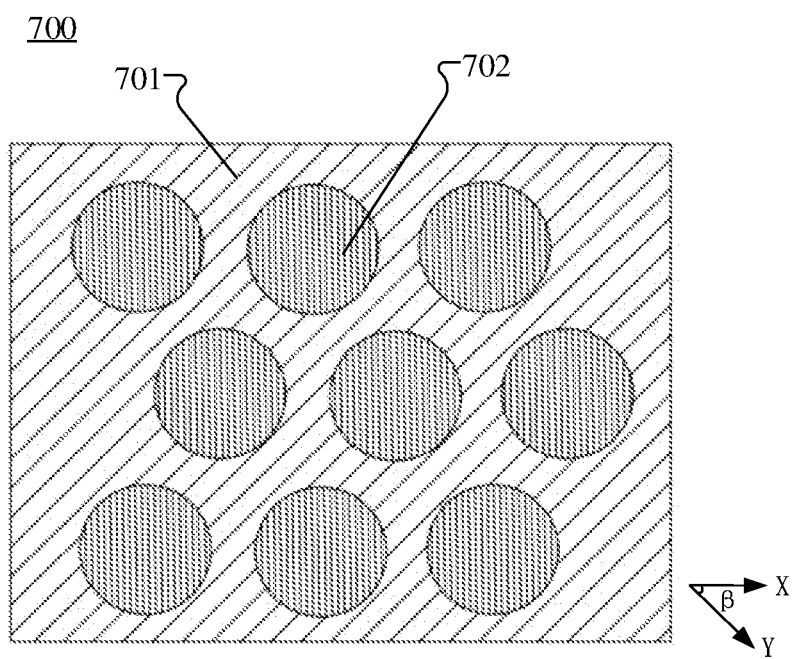
FIG. 11 is a distribution diagram of second patterns in steps of a method of forming a semiconductor structure according to an exemplary embodiment.

As shown in FIG. 8, a second hard mask 600 is formed on the first patterned hard mask 401, and the second hard mask 600 further covers the exposed surface of the second stacked structure 300. As shown in FIG. 9, a patterned second mask layer 700 may be formed on the second hard mask 600 by performing processes such as exposure and development on a photoresist layer. The second mask layer 700 covers the surface of the second hard mask 600. The patterned second mask layer 700 includes a plurality of openings, that is, a plurality of second patterns 702. The second patterns 702 expose partial surface of the second hard mask 600. As shown in FIG. 10 and FIG. 11, the second patterns 702 are arranged in an array in a staggered manner at equal intervals. The second pattern 702 may also be one or more of the following shapes: square, circle, diamond, rectangle, parallelogram, or the like.

In some exemplary embodiments, as shown in FIG. 5 to FIG. 11, the second pattern 702 and the first pattern 502 may have the same shape and size, or the second pattern 702 and the first pattern 502 may have different shapes and sizes. The second patterns 702 and the first patterns 502 may be arranged in the same manner or in different manners.

As shown in FIG. 4 and FIG. 7, the first patterns 502 of the first mask layer 500 are transferred to the first stacked structure 400 to form the opening patterns 402. In a direction perpendicular to the semiconductor substrate 100, projection of the first pattern 502 overlaps with projection of the opening pattern 402. As shown in FIG. 7 and FIG. 9, in a direction perpendicular to the surface of the semiconductor substrate 100, the second pattern 702 and the opening pattern 402 are staggered from each other, such that projection of the second pattern 702 and projection of the opening pattern 402 partially overlap to form an overlapping region. In this case, the overlapping region is a region formed by intersection between the projection of the second pattern 702 and the projection of the first pattern 502.

Figure 12:
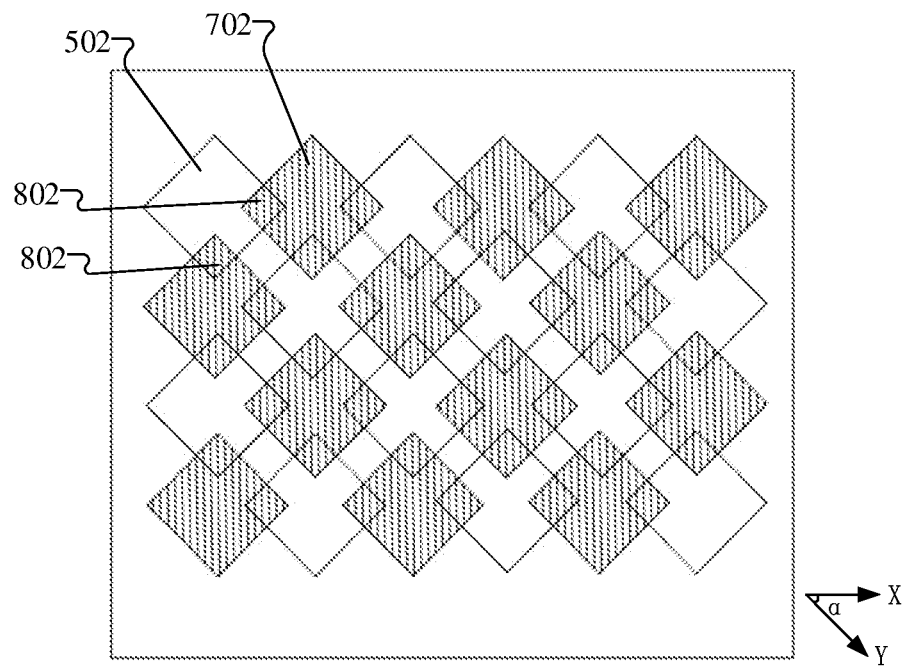
FIG. 12 is a layout diagram of projections of first patterns and projections of second patterns in a same projection plane in steps of a method of forming a semiconductor structure according to an exemplary embodiment.

FIG. 12 shows an example of the projections of the first patterns 502 and the projections of the second patterns 702 in the same projection plane. The projections of the first patterns 502 arranged along a first direction X intersect with the projections of the second patterns 702 arranged along a second direction Y, to form a plurality of overlapping regions in the first direction X and the second direction Y. The overlapping regions are used as the third patterns 802. As shown in FIG. 12, the third patterns 802 are arranged in arrays along the first direction X and the second direction Y respectively. The plurality of third patterns 802 are arranged in a staggered manner.

Step S150: Etch the second hard mask and the second stacked structure by the second mask layer as a mask, to form a third patterned hard mask having the third patterns, and etch the third stacked structure based on the third patterned hard mask as a mask, to form contact holes.

Figure 17:
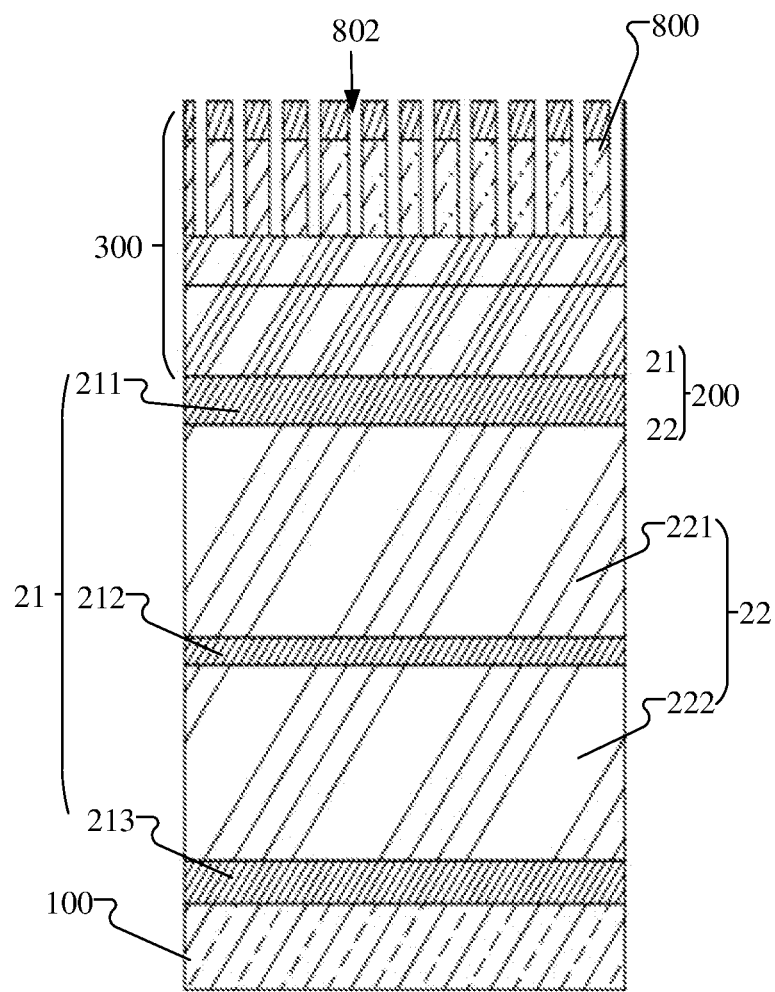
FIG. 17 is a schematic structural diagram after a third patterned hard mask is formed in steps of a manufacturing method of a semiconductor structure according to an exemplary embodiment.
Figure 18:
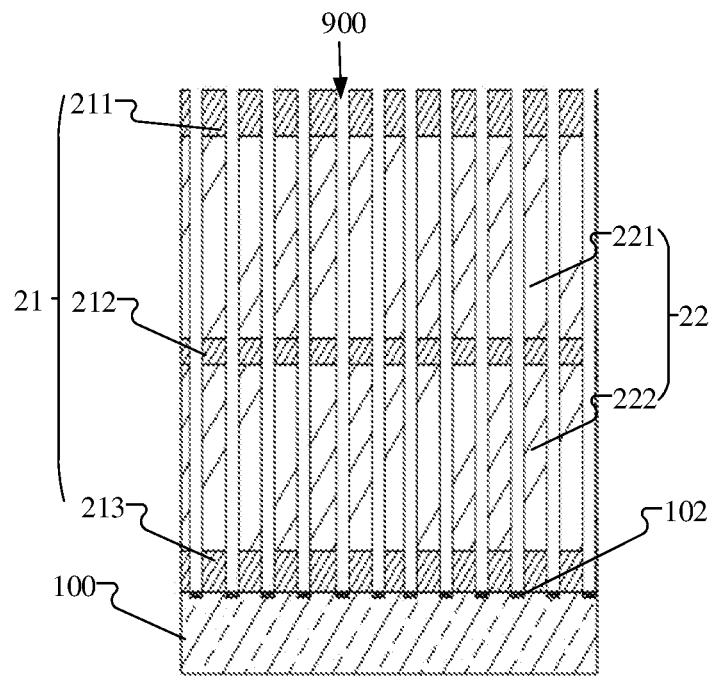
FIG. 18 is a schematic structural diagram after contact holes are formed in steps of a manufacturing method of a semiconductor structure according to an exemplary embodiment.

As shown in FIG. 9 and FIG. 17, the second mask layer 700 covers the surface of the second hard mask 600 and is located above the second stacked structure 300. With the second mask layer 700 as a mask, the second hard mask 600 and the second stacked structure 300 are sequentially etched from top to bottom, such that the third patterns formed by partially overlapping between the first patterns and the second patterns are transferred to the second hard mask 600 and the second stacked structure 300. The second hard mask 600 is removed, and a third patterned hard mask 800 is formed in the second stacked structure 300. The third patterned hard mask 800 has the third patterns 802 arranged in a staggered manner. The third patterned hard mask 800 is located above the third stacked structure 200. Based on the third patterned hard mask 800 as a mask, etching is continued downward along the third patterns 802 until the second stacked structure 300 and the third stacked structure 200 are penetrated, so as to form contact holes 900 with a relatively high depth-to-width ratio in the third stacked structure 200, as shown in FIG. 18.

In the method of forming a semiconductor structure and the semiconductor structure provided by the embodiments of the present disclosure, a first stacked structure is etched by a first mask layer having first patterns, to form a first patterned hard mask. To better retain the first patterns, a second hard mask is formed on the first patterned hard mask, and a second mask layer having second patterns is formed on the second hard mask. The second hard mask and a second stacked structure are etched by the second mask layer as a mask, to define third patterns by overlapping regions between the first patterns of the first mask layer and the second patterns of the second mask layer, such that a third patterned hard mask having the third patterns is formed on a third stacked structure. Then, the third stacked structure is etched along the third patterns based on the third patterned hard mask as a mask, to form a plurality of contact holes with a relatively high level of integration. In the present disclosure, the contact holes with a high integration density are formed by overlapping regions formed between patterns of two mask layers. The integration density of the contact holes is increased without using multiple SADP processes. Therefore, the process is simple, and the cost is low.

In addition, the method of forming a semiconductor structure in the prior art involves multiple SADP processes, which add steps of many etching processes. Moreover, each etching process has more or less impact on the line width uniformity of capacitor structure holes, thus increasing the risk of product defect of the capacitor structure. The method of forming a semiconductor structure provided by the embodiment of the present disclosure improves the integration density of capacitor holes without using multiple SADP processes, which reduces the impact of uncertainties on the device in the etching process, increases the product yield, and also reduces the impact of the exposure limit of photolithography equipment on the device density, thereby improving the level of integration of capacitor structure devices.

Figure 2:
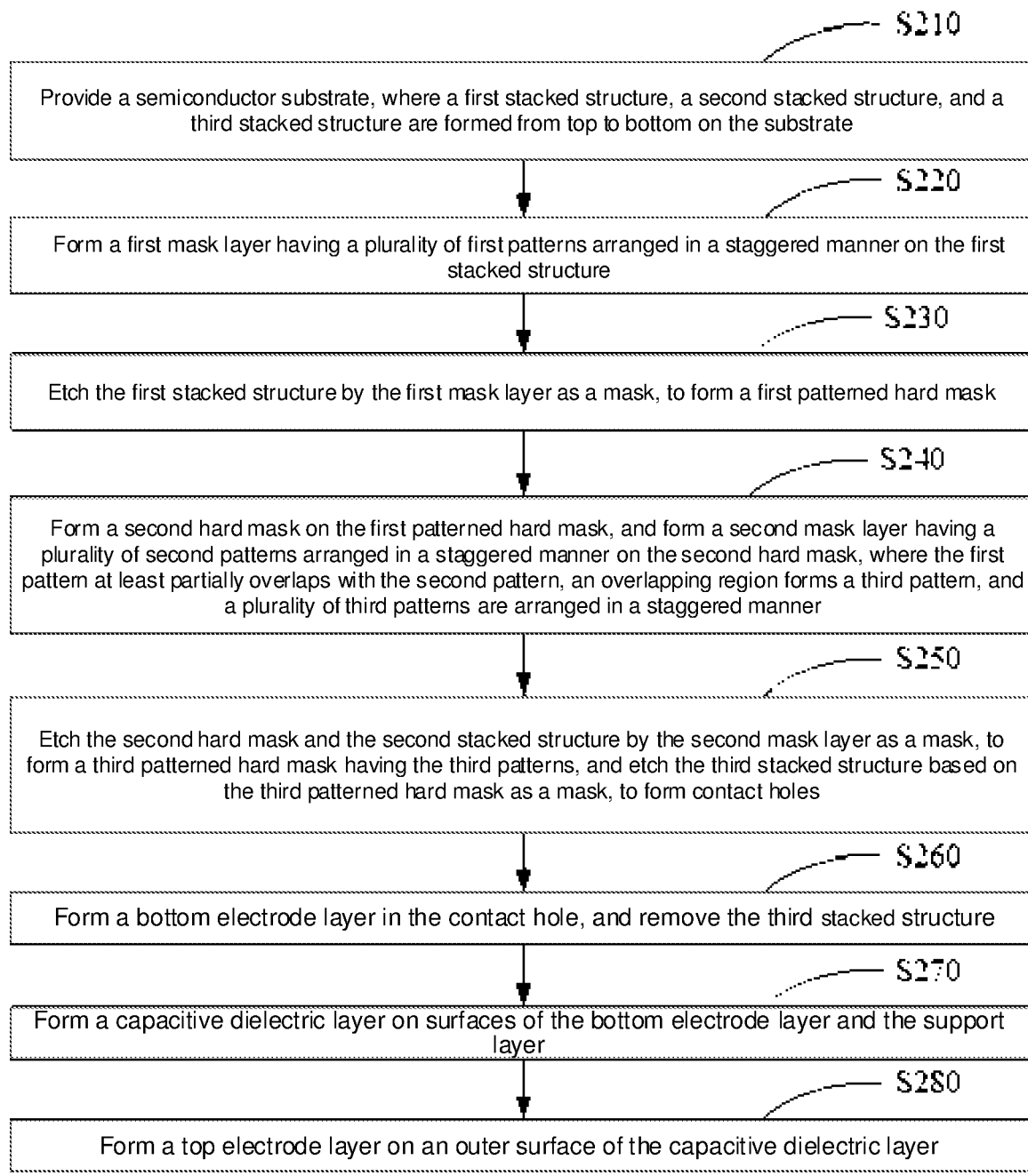
FIG. 2 is a flowchart of a method of forming a semiconductor structure according to an exemplary embodiment.

As shown in FIG. 2, another exemplary embodiment of the present disclosure provides a method of forming a semiconductor structure. The method includes the following steps:

Step S210: Provide a semiconductor substrate, where a first stacked structure, a second stacked structure, and a third stacked structure are formed from top to bottom on the substrate.

As shown in FIG. 4, the first stacked structure 400 on top of the semiconductor substrate 100 may be a two-layer composite structure. The first stacked structure 400 includes a first mask sublayer 403 and a first dielectric sublayer 404 that are sequentially stacked. The first dielectric sublayer 404 covers a surface of the second stacked structure 300, and the first mask sublayer 403 covers a surface of the first dielectric sublayer 404. In some embodiments, a material forming the first mask sublayer 403 is different from a material forming the first dielectric sublayer 404. For example, the first mask sublayer 403 may be made of a nitride, such as silicon nitride; the first dielectric sublayer 404 may be made of an oxide, such as silicon oxide. The first mask sublayer 403 may alternatively be made of a material with an etching rate lower than that of the first dielectric sublayer 404. The first mask sublayer 403 and the first dielectric sublayer 404 may be deposited to reach a thickness as required according to actual needs, which is not specifically limited herein.

As shown in FIG. 2 and FIG. 17, the third stacked structure 200 is connected to the surface of the semiconductor substrate 100. The third stacked structure 200 includes a support layer 21 and a sacrificial dielectric layer 22 stacked alternately. In some embodiments, a bottom material layer and a top material layer of the third stacked structure 200 are both support layers 21, and the sacrificial dielectric layer 22 is located between the two adjacent support layers 21. In some embodiments, the support layer 21 and the sacrificial dielectric layer 22 are made of different materials, and have different etching rates under the same etching condition. The etching rate of the sacrificial dielectric layer 22 is higher than that of the support layer 21. In some exemplary embodiments, the material of the support layer 21 includes silicon nitride, silicon oxynitride or the like. For example, the support layer 21 is made of silicon nitride. The material of the sacrificial dielectric layer 22 includes an oxide. For example, the sacrificial dielectric layer 22 may be made of silicon oxide or silicon oxynitride, which is not specifically limited herein.

As shown in FIG. 17, the third stacked structure 200 includes a first support layer 211, a first sacrificial dielectric layer 221, a second support layer 212, a second sacrificial dielectric layer 222, and a contact pad isolation structure 213 from top to bottom. In some embodiments, the support layer 21 includes a first support layer 211 on the top, a second support layer 212 in the middle, and a contact pad isolation structure 213 at the bottom. The sacrificial dielectric layer 22 includes a first sacrificial dielectric layer 221 located between the first support layer 211 and the second support layer 212, and a second sacrificial dielectric layer 222 located between the second support layer 212 and the contact pad isolation structure 213.

Step S220: Form a first mask layer having a plurality of first patterns arranged in a staggered manner on the first stacked structure.

As shown in FIG. 4, a first photoresist layer 501 is formed on the surface of the first mask sublayer 403. Exposure and development are performed on the first photoresist layer 501, to form a plurality of openings therein, thereby forming a first mask layer 500 having first patterns 502.

FIG. 5 shows an example of distribution of the first patterns 502 on the first photoresist layer 501. The first patterns 502 are arranged in an array along a first direction X. The first direction X may be a direction parallel to a side edge of the first photoresist layer 501. The first patterns 502 are also arranged in an array along a second direction Y. The second direction Y is at a first preset angle α with the first direction X, where the first preset angle α may range from 10 degrees to 90 degrees. For example, an angle between the first direction X and the second direction Y is 30 degrees, 45 degrees, or 60 degrees. An interval between the first patterns 502 in the array in the first direction X may be the same as or different from an interval between the first patterns 502 in the array in the second direction Y. The first patterns 502 in the first direction X are staggered from the first patterns 502 in the second direction Y. Therefore, a first spacing distance exists between any two adjacent first patterns 502. In some embodiments, the size and quantity of the first patterns 502 may be set according to actual situation, which are not specifically limited herein.

In some exemplary embodiments, as shown in FIG. 5, for example, the first pattern 502 is diamond-shaped; the first preset angle α between the first direction X and the second direction Y is 45 degrees. The first patterns 502 are uniformly arranged in the first direction X at intervals of a first distance D1; the first patterns 502 are uniformly arranged in the second direction Y at intervals of a second distance D2, where the first distance D1 and the second distance D2 may be set according to a density requirement of the first patterns 502, and the first distance D1 may be equal or unequal to the second distance D2. Values of the first distance D1 and the second distance D2 are not specifically limited therein. In this embodiment, the first patterns 502 are arranged along two directions that are at an angle of 45 degrees, such that the first patterns 502 are arranged more uniformly on the first photoresist layer 501.

In some exemplary embodiments, as shown in FIG. 6, for example, the first pattern 502 is circular. The first patterns 502 are arranged in arrays along the first direction X and the second direction Y respectively, and the first preset angle α between the first direction X and the second direction Y is 30 degrees. The first pattern 502 may be in another shape, which is not specifically limited herein.

Step S230: Etch the first stacked structure by the first mask layer as a mask, to form a first patterned hard mask.

As shown in FIG. 4, FIG. 5 and FIG. 7, the first patterns 502 expose partial surface of the first mask sublayer 403. The first mask sublayer 403 and the first dielectric sublayer 404 are sequentially etched along the first patterns 502 by the first mask layer 500 having the first patterns 502 as a mask, to form a plurality of opening patterns 402. Each opening pattern 402 penetrates the first mask sublayer 403 and the first dielectric sublayer 404, to expose partial surface of the second stacked structure 300, and the retained first mask sublayer 403 and first dielectric sublayer 404 form the first patterned hard mask 401.

Step S240: Form a second hard mask on the first patterned hard mask, and form a second mask layer having a plurality of second patterns arranged in a staggered manner on the second hard mask, where the first pattern at least partially overlaps with the second pattern, an overlapping region forms a third pattern, and a plurality of third patterns are arranged in a staggered manner.

As shown in FIG. 8, a second hard mask 600 is formed on the first patterned hard mask 401, where the second hard mask 600 includes a second filling sublayer 601 and a second mask sublayer 602. To better retain the first patterns, the second filling sublayer 601 may be made of a material with an etching rate different from that of the material in the first patterned hard mask 401. In some embodiments, the second filling sublayer 601 may be made of a material with an etching rate higher than that of the material of the first mask sublayer 403. In the subsequent etching process, because the etching rate of the first mask sublayer 403 is lower than that of the second filling sublayer 601, the first patterns can be retained.

As shown in FIG. 7 and FIG. 8, the second hard mask 600 may be formed through the following steps: the second filling sublayer 601 may be formed on the first patterned hard mask 401 through atomic layer deposition (ALD), chemical vapor deposition (CVD), or spin coating, where the second filling sublayer 601 fills up gaps between the opening patterns 402 of the first patterned hard mask 401 and also covers the exposed surface of the second stacked structure 300. Next, the second mask sublayer 602 is formed on top surfaces of the second filling sublayer 601 and the first patterned hard mask 401. The second mask sublayer 602 covers surfaces of the second filling sublayer 601 and the first patterned hard mask 401.

In this embodiment, the second filling sublayer 601 is made of a dielectric material with relatively good fluidity, such that the top surface of the second filling sublayer 601 is flush with the top surface of the first patterned hard mask 401.

To better retain the first pattern, a thickness of the second filling sublayer 601 may be different from that of the first mask sublayer 403, where the thickness of the first mask sublayer 403 may be 30% to 90% of the thickness of the second filling sublayer 601. As shown in FIG. 8, the thickness of the formed second filling sublayer 601 may be greater than the thickness of the first mask sublayer 403. As shown in FIG. 8, the thickness of the first mask sublayer 403 may be ⅓ of the thickness of the second filling sublayer 601.

As shown in FIG. 9, next, a second photoresist layer 701 is formed on the second mask sublayer 602, and a plurality of openings may be formed in the second photoresist layer 701 through exposure, development, or other processes, to form the second mask layer 700 having the second patterns 702.

FIG. 10 shows an example of distribution of the second patterns 702 on the second photoresist layer 701. The second patterns 702 are arranged in an array along a first direction X. The first direction X is a direction parallel to a side edge of the second photoresist layer 701. The second patterns 702 are also arranged in an array along a second direction Y. The second direction Y is at a second preset angle β with the first direction X, where the second preset angle β may range from 10 degrees to 90 degrees. For example, the angle between the first direction X and the second direction Y may be 30 degrees, 45 degrees, or 60 degrees. An interval between the second patterns 702 in the array in the first direction X may be the same as or different from an interval between the second patterns 702 in the array in the second direction Y. The second patterns 702 in the first direction X are staggered from the second patterns 702 in the second direction Y. Therefore, a second spacing distance exists between any two adjacent second patterns 702. In some embodiments, the size and quantity of the second patterns 702 may be set according to actual situation, which are not specifically limited herein.

In some exemplary embodiments, as shown in FIG. 5 and FIG. 10, for example, the second pattern 702 is diamond-shaped. The second pattern 702 has the same shape and size as the first pattern 502, and distribution manners of the second patterns 702 and the first patterns 502 are also the same. For example, the second patterns 702 are arranged in arrays along the first direction X and the second direction Y that are at an angle of 45 degrees. In the first direction X, a distance between two adjacent second patterns 702 is D1; in the second direction Y, a distance between two adjacent second patterns 702 is D2. In some embodiments, the first patterns 502 on the first mask layer 500 are staggered from the second patterns 702 on the second mask layer 700.

For ease of description, FIG. 12 shows the layout of the projections of the first patterns 502 and the projections of the second patterns 702 in the same projection plane in a direction perpendicular to the semiconductor substrate 100, where an angle α exists between the first direction X and the second direction Y, for example, α is 30 degrees. The first patterns 502 and the second patterns 702 are arranged uniformly along the first direction X in a staggered manner; the first patterns 502 and the second patterns 702 are also arranged uniformly along the second direction Y in a staggered manner, such that the first patterns 502 and the second patterns 702 form overlapping regions in the first direction X and the second direction Y respectively, i.e., form the third patterns 802 arranged in an array. As shown in FIG. 12, the third patterns 802 are uniformly arranged along the first direction X and the second direction Y. The third patterns 802 in the first direction X are staggered from the third patterns 802 in the second direction Y.

Figure 13:
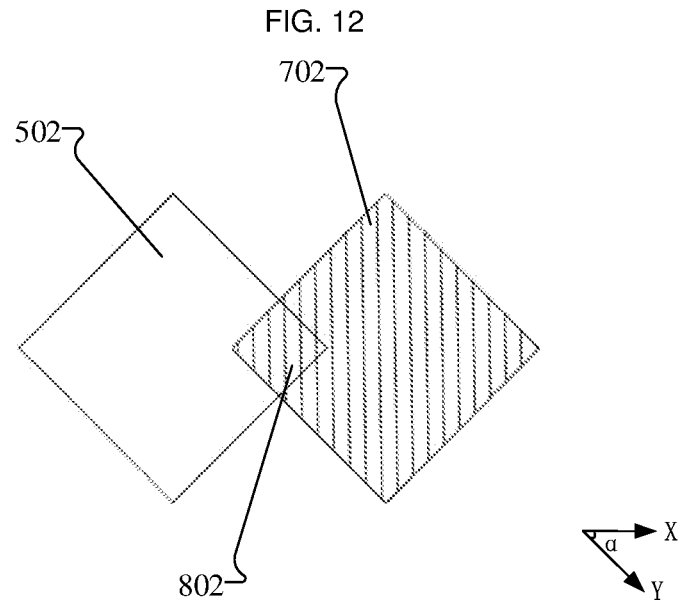
FIG. 13 is a schematic diagram of partially overlapping first pattern and second pattern in a same projection plane in steps of a method of forming a semiconductor structure according to an exemplary embodiment.

The third pattern is formed by the overlapping region between the first pattern and the second pattern. Therefore, the size and density of the third patterns may depend on the overlapping regions between the first patterns and the second patterns. In this case, the size and density of the contact holes may be determined through the third patterns. As shown in FIG. 13, the first pattern 502 and the second pattern 702 are identical parallelograms. In the same projection plane, the third pattern 802 can be formed only when the projection of at least one second pattern 702 partially overlaps with the projection of at least one of the first patterns 502. Therefore, the density of the formed third patterns 802 may be equal to the density of the first patterns 502 or the second patterns 702.

Figure 14:
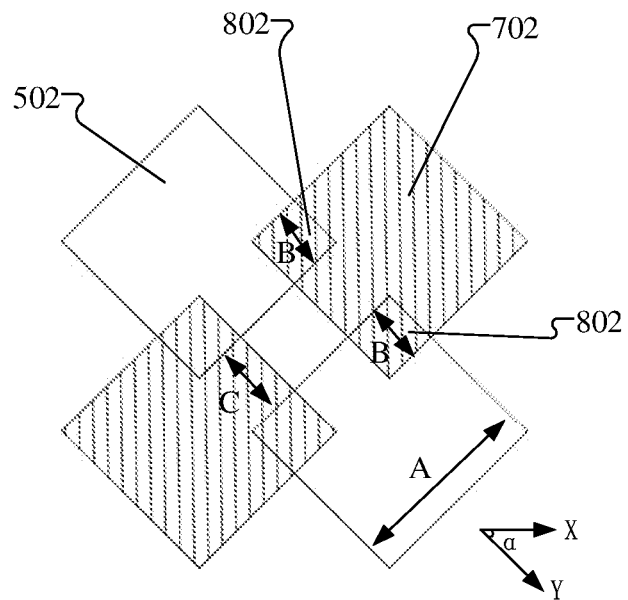
FIG. 14 is a schematic diagram of partially overlapping first patterns and second patterns in a same projection plane in steps of a method of forming a semiconductor structure according to an exemplary embodiment.
Figure 15:
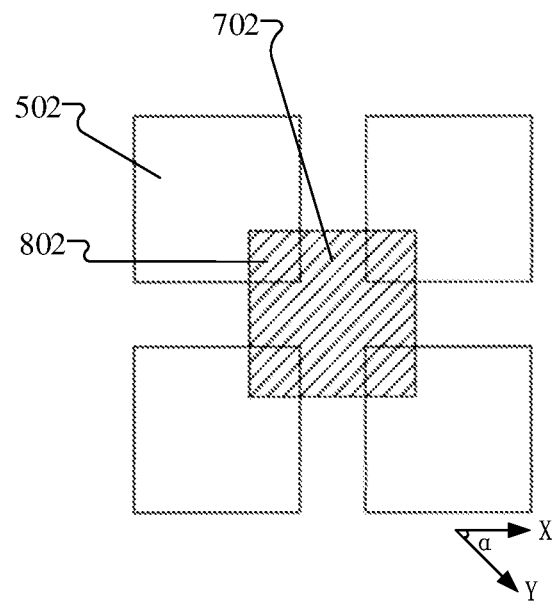
FIG. 15 is a schematic diagram of partially overlapping first patterns and second pattern in a same projection plane in steps of a method of forming a semiconductor structure according to an exemplary embodiment.
Figure 16:
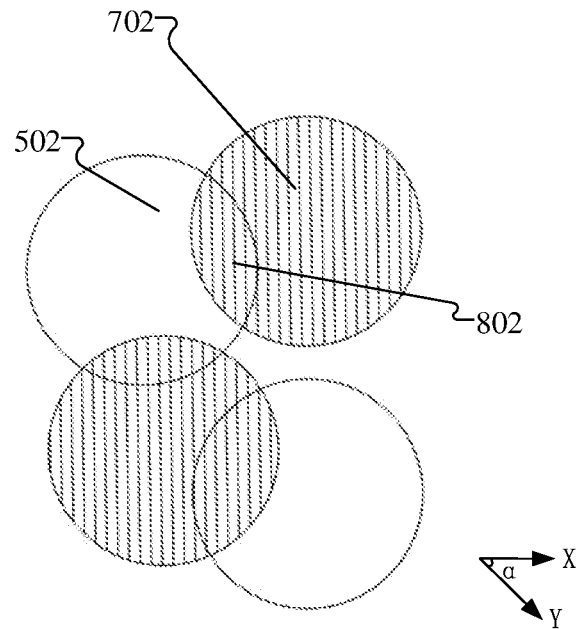
FIG. 16 is a schematic diagram of partially overlapping first patterns and second patterns in a same projection plane in steps of a method of forming a semiconductor structure according to an exemplary embodiment.

In some exemplary embodiments, the projection of each second pattern may partially overlap with the projections of two or more first patterns. Therefore, a plurality of third patterns can be formed within each second pattern. FIG. 14 is a schematic diagram of an example of a plurality of overlapping regions formed between two second patterns 702 and two first patterns 502. In this embodiment, the first pattern 502 and the second pattern 702 are identical parallelograms with the same size. Two second patterns 702 and two first patterns 502 form four third patterns. FIG. 15 is a schematic diagram of an example of a plurality of overlapping regions formed between one second pattern 702 and four first patterns 502. The first pattern 502 and the second pattern 702 are identical squares with the same size. One second pattern 702 forms four third patterns 802 with four first patterns 502. As shown in FIG. 16, the first patterns 502 and the second patterns 702 are identical circles, and form a plurality of overlapping regions. As shown in FIG. 14 to FIG. 16, a plurality of overlapping regions are formed within the projection of each second pattern 702 or first pattern. As can be seen, the density of the third patterns 802 is greater than the density of the first patterns 502, and the density of the third patterns 802 is also greater than the density of the second patterns 702.

Step S250: Etch the second hard mask and the second stacked structure by the second mask layer as a mask, to form a third patterned hard mask having the third patterns, and etch the third stacked structure based on the third patterned hard mask as a mask, to form contact holes.

As shown in FIG. 9 and FIG. 17, by the second mask layer 700 having the second patterns 702 as a mask, the second hard mask 600 and the second stacked structure 300 are etched along the second patterns 702, such that the overlapping regions formed between the first patterns 502 and the second patterns 702 are further transferred downward, to form a plurality of openings, that is, the third patterns 802, in the second hard mask 600 and the second stacked structure 300. The retained second hard mask 600 and the second stacked structure 300 serve as the third patterned hard mask 800 having the third patterns 802, then the second hard mask 600 is removed, and the second stacked structure 300 and the third stacked structure 200 are further etched downward along the third patterns 802. As shown in FIG. 18, the first support layer 211, the first sacrificial dielectric layer 221, the second support layer 212, the second sacrificial dielectric layer 222, and the contact pad isolation structure 213 are sequentially etched, to form the contact holes 900 that have a relatively high depth-to-width ratio and penetrate the support layer 21 and the sacrificial dielectric layer 22 from top to bottom.

As can be seen, the size of the third pattern can further determine the size of the contact hole. Because the size of the third pattern may be a width of the overlapping region between the first pattern and the second pattern, the size of the third pattern is related to the sizes of the first pattern and the second pattern. For example, a maximum size of the third pattern may be 10% to 40% of a maximum size of the first pattern or second pattern. As shown in FIG. 14, the projections of two second patterns 702 and the projections of two first patterns 502 form four third patterns 802. Within the projection of the second pattern 702, the second pattern 702 in the first direction X forms third patterns 802 of the same size with the two first patterns 502 in the second direction Y, where the width of each third pattern 802 is B. In some embodiments, the width of the first pattern 502 is A, and the width B of the third pattern 802 may be ⅓ of the width A of the first pattern 502, that is, B=A*⅓. In some embodiments, the width A of the first pattern 502 may be an exposure limit value. In this embodiment, the size of the third pattern allows the size of the finally formed contact hole to be ⅓ of the exposure limit, such that the process limit is decreased to be lower than a limit value of exposure equipment, which reduces the process limit and improves the integration density of the contact holes, thereby obtaining capacitor structures with a high level of integration.

Figure 19:
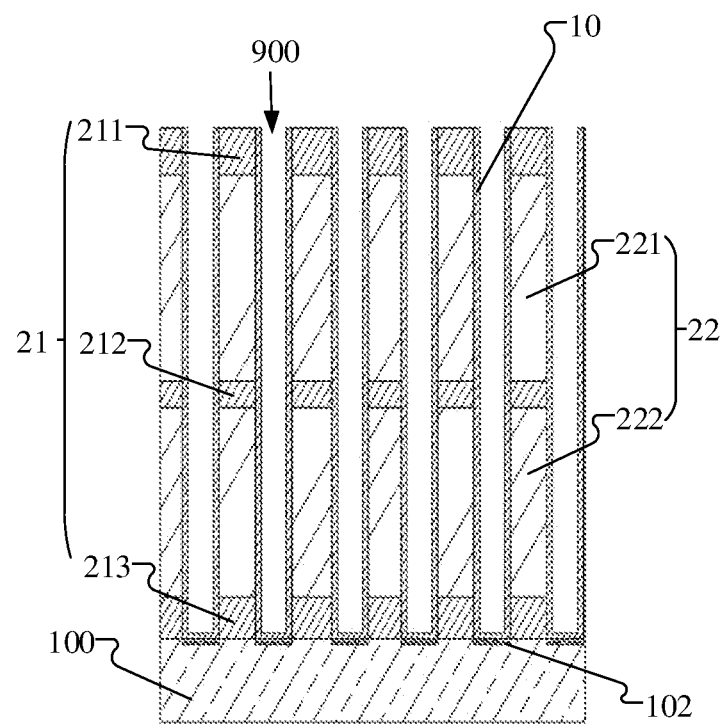
FIG. 19 is a schematic structural diagram after a bottom electrode layers is formed in steps of a manufacturing method of a semiconductor structure according to an exemplary embodiment.

In this embodiment, as shown in FIG. 18, the semiconductor substrate 100 is further provided with a plurality of contact pads 102. The contact pad 102 may serve as a contact structure of the capacitor structure. Based on the third patterned hard mask 800, the third stacked structure 200 is etched until partial upper surface of the contact pad 102 located on the surface of the semiconductor substrate 100 is exposed. Then, etching is stopped. In some embodiments, the quantity of the contact pads 102 may vary according to actual needs, which is not specifically limited herein. FIG. 19 shows an example of six contact pads 102. A source region and a drain region (not shown in the figure) may further be arranged in the semiconductor substrate 100.

Step S260: Form a bottom electrode layer in the contact hole, and remove the third stacked structure.

As shown in FIG. 19, a plurality of contact holes 900 penetrate the third stacked structure 200 along the thickness direction, to expose the contact pads 102. A bottom electrode material may be deposited on a sidewall of the contact hole 900, the upper surface of the contact pad 102, and the upper surface of the first support layer 211 through chemical vapor deposition; then, the bottom electrode material at the upper surface of the first support layer 211 is removed through etching, while the bottom electrode material on the sidewall of the contact hole 900 and on the contact pad 102 are retained to serve as a bottom electrode layer 10. In some embodiments, the bottom electrode material may be one or more from the group consisting of titanium nitride, titanium oxide, titanium carbide, and tungsten.

Figure 20:
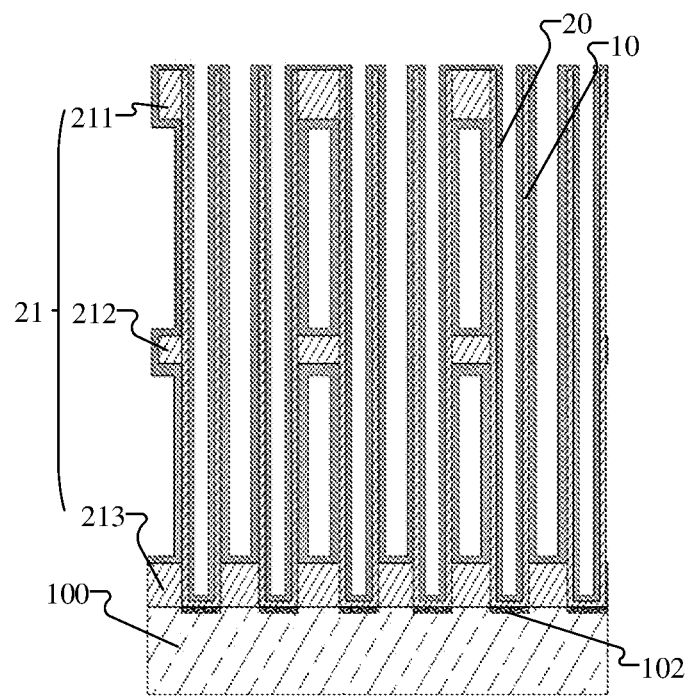
FIG. 20 is a schematic structural diagram after a capacitive dielectric layer is formed in steps of a manufacturing method of a semiconductor structure according to an exemplary embodiment.

As shown in FIG. 20, the sacrificial dielectric layer 22 in the third stacked structure 200 may be removed through dry etching, wet etching, or a combination of dry etching and wet etching, while the support layer 21 is retained on the semiconductor substrate 100. As shown in FIG. 20, the first sacrificial dielectric layer 221 and the second sacrificial dielectric layer 222 may be sequentially removed through wet etching, while the first support layer 211, the second support layer 212, and the contact pad isolation structure 213 are retained. In some embodiments, the top of the bottom electrode layer 10 is connected to the first support layer 211, the middle of the bottom electrode layer 10 is connected to the second support layer 212, and the bottom of the bottom electrode layer 10 is connected to the contact pad isolation structure 213.

Step S270: Form a capacitive dielectric layer on surfaces of the bottom electrode layer and the support layer.

As shown in FIG. 20, a capacitive dielectric layer 20 may be formed on an inner surface and outer surface of the bottom electrode layer 10 and the surface of the retained support layer 21 through chemical vapor deposition. The capacitive dielectric layer 20 covers the surface of the bottom electrode layer 10 as well as the surfaces of the first support layer 211, the second support layer 212, and the contact pad isolation structure 213. In some embodiments, a material forming the capacitive dielectric layer 20 may be a high-K material. In some embodiments, the material of the capacitive dielectric layer 20 may be one or more from the group consisting of zirconium oxide (ZrOx), hafnium oxide (HfOx), titanium-zirconium oxide (ZrTiOx), ruthenium oxide (RuOx), antimony oxide (SbOx), and aluminum oxide (AlOx).

Step S280: Form a top electrode layer on an outer surface of the capacitive dielectric layer.

Figure 21:
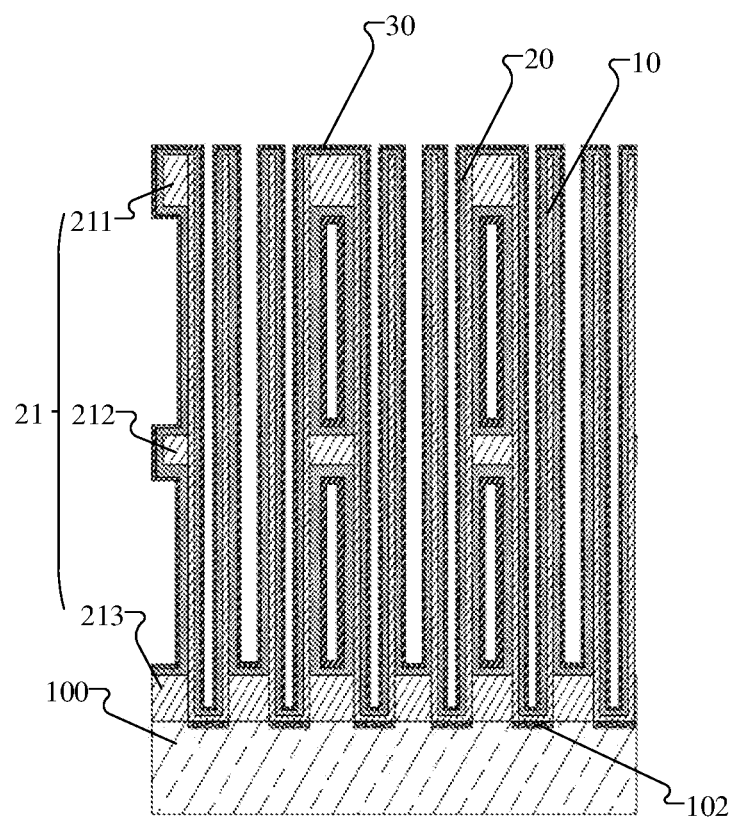
FIG. 21 is a schematic structural diagram after a top electrode layer is formed in steps of a manufacturing method of a semiconductor structure according to an exemplary embodiment.

As shown in FIG. 21, a top electrode layer 30 may be further formed on an outer surface of the capacitive dielectric layer 20 through chemical vapor deposition. The top electrode layer 30 covers the surface of the capacitive dielectric layer 20. In some embodiments, the material of the top electrode layer 30 may be one or more from the group consisting of polysilicon, titanium nitride, titanium oxide, titanium carbide, and tungsten. For example, the top electrode layer 30 is made of titanium nitride. Due to the presence of the first support layer 211, the second support layer 212 and the contact pad isolation structure 213, the mechanical strength of the capacitor structure array is improved.

Figure 22:
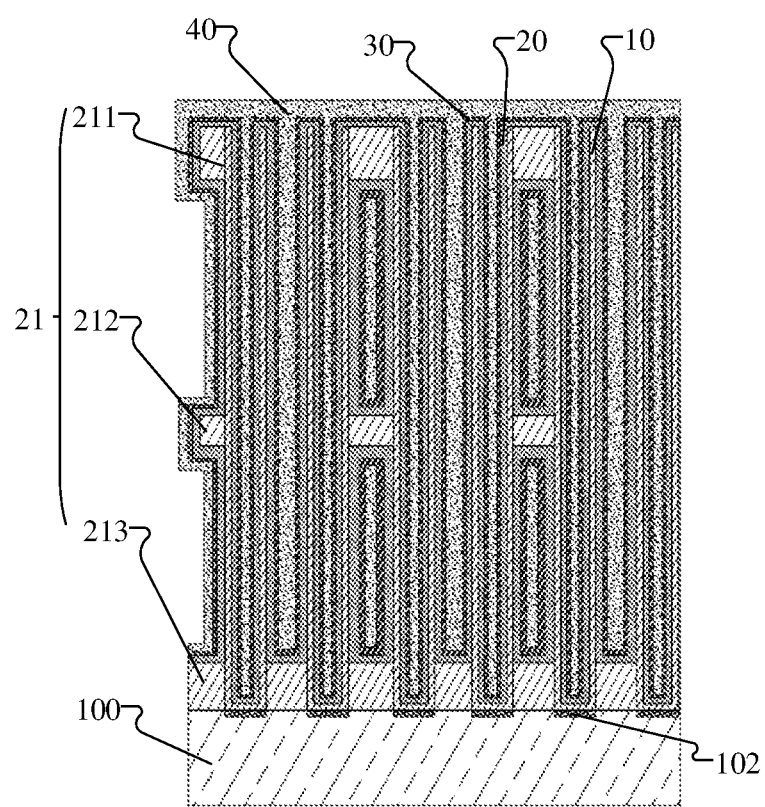
FIG. 22 is a schematic structural diagram after a dielectric layer is formed in steps of a manufacturing method of a semiconductor structure according to an exemplary embodiment.

As shown in FIG. 21, the bottom electrode layer 10, the capacitive dielectric layer 20, and the top electrode layer 30 on the semiconductor substrate 100 form a capacitor structure. In this way, capacitor structures having a high level of integration and arranged in an array are formed based on the contact holes 900. The capacitor structure formed on the semiconductor substrate 100 may be connected to the source region or drain region (not shown in the figure) through the contact pad. As shown in FIG. 22 a dielectric layer 40 is formed on the surface of the top electrode layer 30, where the dielectric layer 40 may serve as an insulating layer.

FIG. 21 or FIG. 22 is a schematic structural diagram of a semiconductor structure according to an exemplary embodiment of the present disclosure. The semiconductor structure is manufactured by the method of forming a semiconductor structure provided by the foregoing embodiment. The semiconductor structure includes:

a semiconductor substrate 100, and contact pads 102, contact holes 900, and a support layer 21 that are arranged on the semiconductor substrate 100, where the contact hole 900 at least partially exposes an upper surface of the contact pad 102, and a contact pad isolation structure 213 is arranged between adjacent contact pads 102;

a bottom electrode layer 10, arranged in the contact hole 900 and covering an upper surface of the exposed contact pad 102, where the bottom electrode layer 10 is connected to the support layer 21;

a capacitive dielectric layer 20, covering surfaces of the bottom electrode layer 10 and the support layer 21; and a top electrode layer 30, covering an outer surface of the capacitive dielectric layer 20.

In some exemplary embodiments, the support layer 21 includes a first support layer 211, a second support layer 212, and the contact pad isolation structure 213.

In some embodiments, a top of the bottom electrode layer 10 is connected to the first support layer 211, a middle of the bottom electrode layer 10 is connected to the second support layer 212, and a bottom of the bottom electrode layer 10 is connected to the contact pad isolation structure 213.

The capacitive dielectric layer 20 covers surfaces of the bottom electrode layer 10, the first support layer 211, the second support layer 212, and the contact pad isolation structure 213.

In the semiconductor structure provided by the embodiment of the present disclosure, the size of the contact hole can be decreased to be less than the exposure limit, which reduces the process limit and improves the integration density of capacitor holes, thereby forming capacitor structures with a high level of integration. The process is simple, and the cost is low.

The embodiments or implementations of this specification are described in a progressive manner, and each embodiment focuses on differences from other embodiments. The same or similar parts between the embodiments may refer to each other.

In the description of this specification, the description with reference to terms such as "an embodiment", "an exemplary embodiment", "some implementations", "a schematic implementation", and "an example" means that the specific feature, structure, material, or characteristic described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the accompanying drawings. These terms are merely intended to facilitate description of the present disclosure and simplify the description, rather than to indicate or imply that the mentioned apparatus or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one structure from another.

The same elements in one or more accompanying drawings are denoted by similar reference numerals. For the sake of clarity, various parts in the accompanying drawings are not drawn to scale. In addition, some well-known parts may not be shown. For the sake of brevity, a structure obtained by implementing a plurality of steps may be shown in one figure. In order to understand the present disclosure more clearly, many specific details of the present disclosure, such as the structure, material, size, processing process, and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

The invention claimed is:

1. A method of forming a semiconductor structure, comprising:

providing a semiconductor substrate, wherein a first stacked structure, a second stacked structure, and a third stacked structure are formed from top to bottom on the semiconductor substrate;

forming a first mask layer having a plurality of first patterns arranged in a staggered manner on the first stacked structure;

etching the first stacked structure by the first mask layer as a mask, to form a first patterned hard mask;

forming a second hard mask on the first patterned hard mask, and forming a second mask layer having a plurality of second patterns arranged in a staggered manner on the second hard mask, wherein the first pattern at least partially overlaps with the second pattern, an overlapping region forms a third pattern, and a plurality of third patterns are arranged in a staggered manner; and etching the second hard mask and the second stacked structure by the second mask layer as a mask, to form a third patterned hard mask having the third patterns, and etching the third stacked structure based on the third patterned hard mask as a mask, to form contact holes;

wherein the second hard mask comprises a second filling sublayer and a second mask sublayer, the second filling sublayer is formed in gaps of the first patterned hard mask, and the second mask sublayer is formed above the second filling sublayer and the first patterned hard mask.

2. The method of forming a semiconductor structure according to claim 1, wherein a top surface of the second filling sublayer is flush with a top surface of the first patterned hard mask.

3. The method of forming a semiconductor structure according to claim 2, wherein an etching rate of the first stacked structure is different from an etching rate of the second filling sublayer.

4. The method of forming a semiconductor structure according to claim 3, wherein the first stacked structure comprises a first mask sublayer and a first dielectric sublayer, and an etching rate of the first mask sublayer is less than the etching rate of the second filling sublayer.

5. The method of forming a semiconductor structure according to claim 4, wherein a thickness of the first mask sublayer is 30% to 90% of a thickness of the second filling sublayer.

6. The method of forming a semiconductor structure according to claim 1, wherein the first stacked structure comprises three or less than three layers.

7. The method of forming a semiconductor structure according to claim 1, wherein a density of the third patterns is greater than a density of the first patterns and a density of the second patterns.

8. The method of forming a semiconductor structure according to claim 1, wherein a maximum size of the third pattern is 10% to 40% of a maximum size of the first pattern or the second pattern.

9. The method of forming a semiconductor structure according to claim 1, wherein the first pattern and the second pattern comprise a parallelogram.

10. The method of forming a semiconductor structure according to claim 1, wherein the plurality of first patterns are uniformly arranged along a first direction and a second direction, a first preset angle exists between the first direction and the second direction, and a first spacing distance exists between any two adjacent first patterns.

11. The method of forming a semiconductor structure according to claim 1, wherein the plurality of second patterns are uniformly arranged along a first direction and a second direction, a second preset angle exists between the first direction and the second direction, and a second spacing distance exists between any two adjacent second patterns.

12. The method of forming a semiconductor structure according to claim 1, wherein projection of each of the second patterns partially overlaps with projection of at least one of the first patterns, and at least one overlapping region is formed in a region of each of the second patterns.

13. The method of forming a semiconductor structure according to claim 1, wherein the third stacked structure comprises a support layer and a sacrificial dielectric layer.

14. The method of forming a semiconductor structure according to claim 13, the method further comprises:
    forming a bottom electrode layer in the contact hole, and removing the third stacked structure;
    forming a capacitive dielectric layer on surfaces of the bottom electrode layer and the support layer; and
    forming a top electrode layer on an outer surface of the capacitive dielectric layer.

15. The method of forming a semiconductor structure according to claim 1, wherein the semiconductor substrate comprises contact pads, and the contact hole at least partially exposes an upper surface of the contact pad.

* * * * *